(12) United States Patent
Mori et al.

(10) Patent No.: US 8,289,104 B2
(45) Date of Patent: Oct. 16, 2012

(54) ELECTRONIC COMPONENT

(75) Inventors: Takahiro Mori, Nagaokakyo (JP);
Hiroshi Masuda, Nagaokakyo (JP)

(73) Assignee: Murata Manufacturing Co., Ltd.,
Kyoto (JP)

( * ) Notice: Subject to any disclaimer, the term of this patent is extended or adjusted under 35 U.S.C. 154(b) by 0 days.

(21) Appl. No.: 13/278,207

(22) Filed: Oct. 21, 2011

(65) Prior Publication Data

US 2012/0032758 A1    Feb. 9, 2012

Related U.S. Application Data

(63) Continuation of application No. PCT/JP2010/056665, filed on Apr. 14, 2010.

(30) Foreign Application Priority Data

Apr. 24, 2009   (JP) .................................. 2009-106047

(51) Int. Cl.
*H03H 7/09*   (2006.01)

(52) U.S. Cl. ........................................ 333/175; 333/185

(58) Field of Classification Search .................. 333/175, 333/176, 185, 204, 205, 219, 235
See application file for complete search history.

(56) References Cited

U.S. PATENT DOCUMENTS 8,102,222 B2 *   1/2012   Mizutani et al. .............. 333/175
2007/0241839 A1 * 10/2007   Taniguchi ..................... 333/185

FOREIGN PATENT DOCUMENTS

| EP | 2 009 787 A1 | 12/2008 |
|----|----|----|
| JP | 09-307389 A | 11/1997 |
| JP | 2001-345213 A | 12/2001 |
| WO | 2007/119356 A1 | 10/2007 |
| WO | WO2008/114681 * | 9/2008 |

OTHER PUBLICATIONS

Official Communication issued in International Patent Application No. PCT/JP2010/056665, mailed on Jun. 8, 2010.

* cited by examiner

*Primary Examiner* — Robert Pascal
*Assistant Examiner* — Gerald Stevens
(74) *Attorney, Agent, or Firm* — Keating & Bennett, LLP

(57) ABSTRACT

In an electronic component, a first LC resonant circuit includes a first coil including coil portions that extend from a first external electrode to a second external electrode while turning in a first direction. A second LC resonant circuit includes a second coil including coil portions that extend from a third external electrode to a fourth external electrode while turning in the first direction. A third LC resonant circuit includes a third coil and a capacitor. The third coil includes coil portions that extend from the capacitor of the third LC resonant circuit to the second external electrode while turning in a second direction opposite to the first direction around the coil portions of the first coil and the second coil.

4 Claims, 4 Drawing Sheets

ELECTRONIC COMPONENT

BACKGROUND OF THE INVENTION

1. Field of the Invention

The present invention relates to electronic components, and, more particularly, to an electronic component including a filter.

2. Description of the Related Art

As a known electronic component in the related art, for example, a multilayer LC filter is disclosed in Japanese Unexamined Patent Application Publication No. 9-307389. FIG. 4 is a partially exploded perspective view of a laminate 102 in a multilayer LC filter 100 disclosed in Japanese Unexamined Patent Application Publication No. 9-307389. FIG. 5 is an equivalent circuit diagram of the multilayer LC filter 100.

The laminate 102 includes laminated rectangular insulating layers 104a to 104g, an inner conductor 105, and strip lines 106a to 106c. The inner conductor 105 is disposed on the insulating layer 104b, and functions as a shield to prevent an unnecessary wave from entering the laminate 102. The strip lines 106a and 106c are disposed on the insulating layer 104d, and extend along short sides of the insulating layer 104d. The strip line 106b is disposed on the insulating layer 104f, and extends between the strip lines 106a and 106c along short sides of the insulating layer 104f in plan view from a lamination direction. A capacitor layer is disposed under the laminate 102, and is connected to the strip lines 106a to 106c via an external relay electrode.

As illustrated in FIG. 5, the multilayer LC filter 100 includes three LC resonant circuits LC101 to LC103. The LC resonant circuit LC101 includes a coil L101 and a capacitor C101. The strip line 106a forms the coil L101. The LC resonant circuit LC102 includes a coil L102 and a capacitor C102. The strip line 106b forms the coil L102. The LC resonant circuit LC103 includes a coil L103 and a capacitor C103. The strip line 106c forms the coil L103. The LC resonant circuits LC101 and LC103 are connected to an input electrode 110a and an output electrode 110b via capacitors C100 and C104, respectively.

In the multilayer LC filter 100 having the above-described configuration, the strip lines 106a and 106b are electromagnetically coupled to each other, and the strip lines 106b and 106c are electromagnetically coupled to each other. As a result, the multilayer LC filter 100 forms a band-pass filter.

An exemplary operation of the multilayer LC filter 100 will be described. As illustrated in FIGS. 4 and 5, one end of the coil L101 (the strip line 106a) is connected to the input electrode 110a via the capacitor C100, and the other end of the coil L101 (the strip line 106a) is connected to the ground. Therefore, a current i101 passes through the coil L101 from the input electrode 110a to the ground.

The coil L102 is connected to the capacitor C102, and is not connected to the ground. The strip line 106a (the coil L101) and the strip line 106b (the coil L102) are electromagnetically coupled to each other. Accordingly, when the current i101 passes through the strip line 106a (the coil L101), a current i102 passes through the strip line 106b (the coil L102) in a direction opposite to that of the current i101 by electromagnetic induction as illustrated in FIG. 4.

As illustrated in FIGS. 4 and 5, one end of the coil L103 (the strip line 106c) is connected to the output electrode 110b via the capacitor C104, and the other end of the coil L103 (the strip line 106c) is connected to the ground. Therefore, a current i103 passes through the coil L103 from the output electrode 110b to the ground.

As will be described later, in the multilayer LC filter 100, it is difficult to achieve both miniaturization and the narrowing of a frequency band. More specifically, since the strip lines 106a to 106c forming the coils L101 to L103 are straight in the multilayer LC filter 100, magnetic fluxes are generated around the strip lines 106a to 106c. In this case, the magnetic fluxes generated at the coils L101 to L103 are distributed over a relatively wide area. Accordingly, the coils L101 to L103 are easily electromagnetically coupled to one another, and a coupling coefficient among the coils L101 to L103 is increased. When a coupling coefficient between coils is increased, a pass band for a signal is broadened. Accordingly, in the multilayer LC filter 100, a pass band for a signal is broadened.

In order to reduce the coupling coefficient among the coils L101 to L103, a method of increasing the distances between the strip lines 106a to 106c may be considered. Using this method, magnetic coupling among the coils L101 to L103 can be weakened.

However, in this case, the multilayer LC filter 100 is increased in size. Therefore, it is difficult to achieve both miniaturization and the narrowing of a frequency band in the multilayer LC filter 100.

SUMMARY OF THE INVENTION

In order to overcome the problems described above, preferred embodiments of the present invention achieve miniaturization and narrowing of a pass band for a signal in an electronic component including a resonant circuit.

An electronic component according to a preferred embodiment of the present invention preferably includes a laminate, an input electrode, an output electrode, and a ground electrode that are disposed on surfaces of the laminate, a first resonant circuit including a first coil that includes a first coil portion that extends from the input electrode to the ground electrode while turning in a predetermined direction in plan view from a lamination direction of the laminate, a second resonant circuit including a second coil that includes a second coil portion that extends from the output electrode to the ground electrode while turning in the predetermined direction in plan view from the lamination direction of the laminate, and a third resonant circuit including a third coil electromagnetically coupled to the first coil and the second coil and a third capacitor. The third coil preferably includes a third coil portion that extends from the third capacitor to the ground electrode while turning in a direction opposite to the predetermined direction around the first coil portion and the second coil portion in plan view from the lamination direction of the laminate.

According to various preferred embodiments of the present invention, it is possible to achieve miniaturization and narrowing of a pass band for a signal in an electronic component including a resonant circuit.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

An electronic component according to preferred embodiments of the present invention will be described below.

Figure 1:
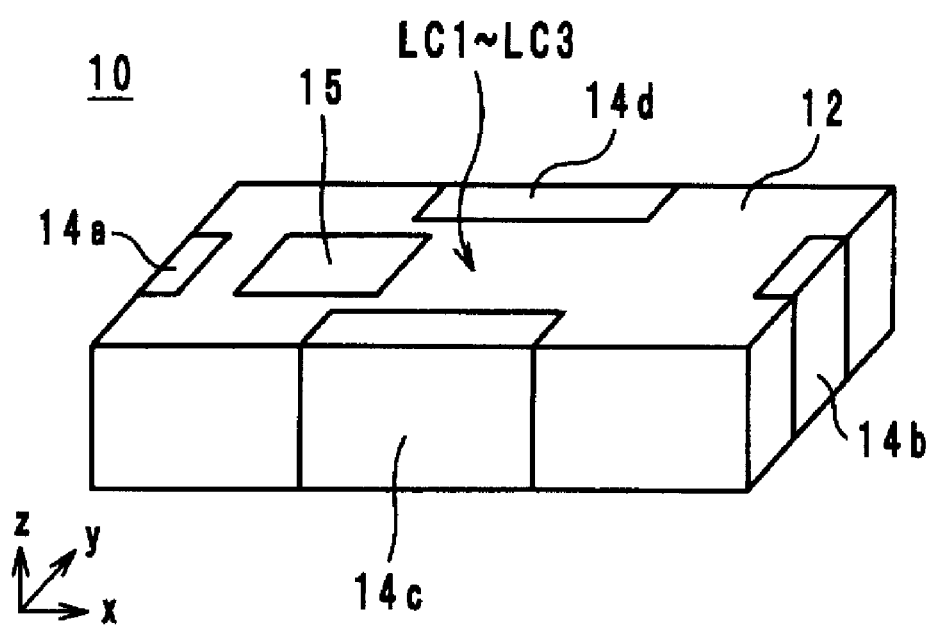
FIG. 1 is an external perspective view of an electronic component according to a preferred embodiment of the present invention.
Figure 2:
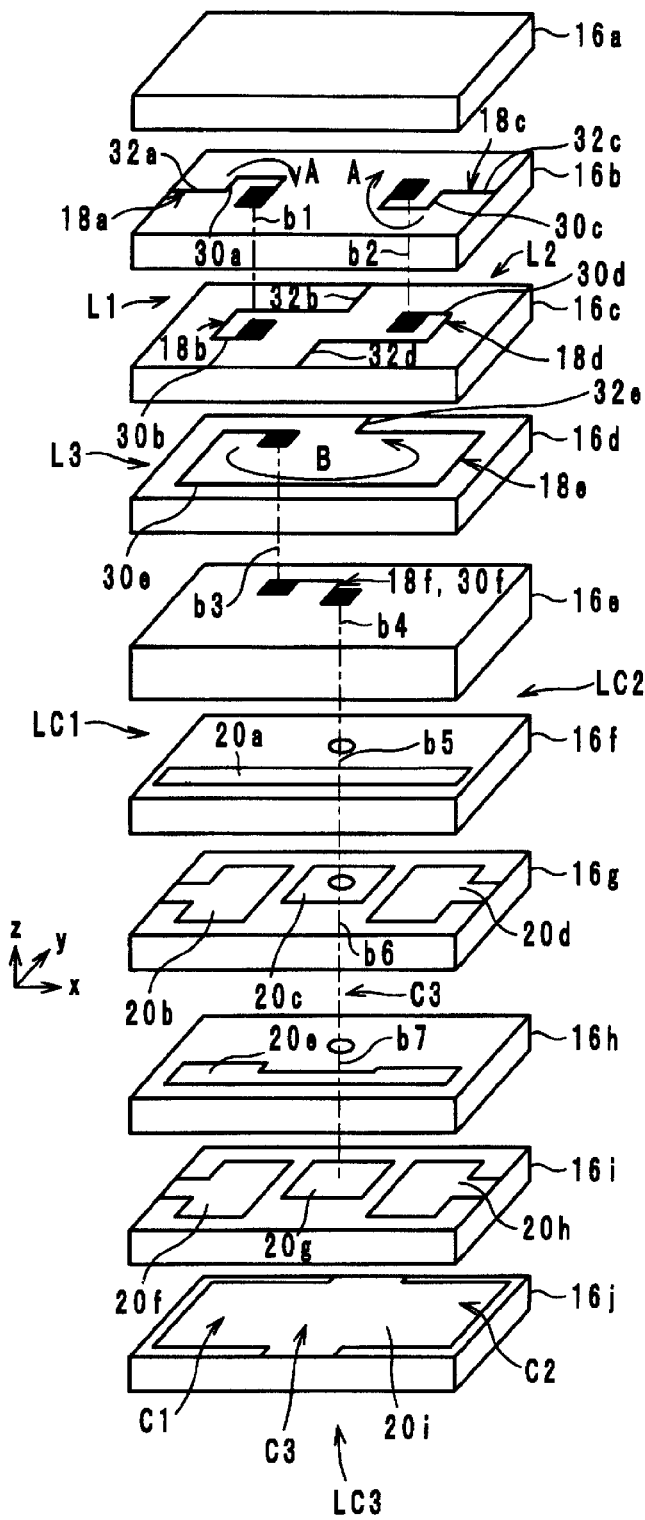
FIG. 2 is an exploded perspective view of a laminate in the electronic component illustrated in FIG. 1.
Figure 3:
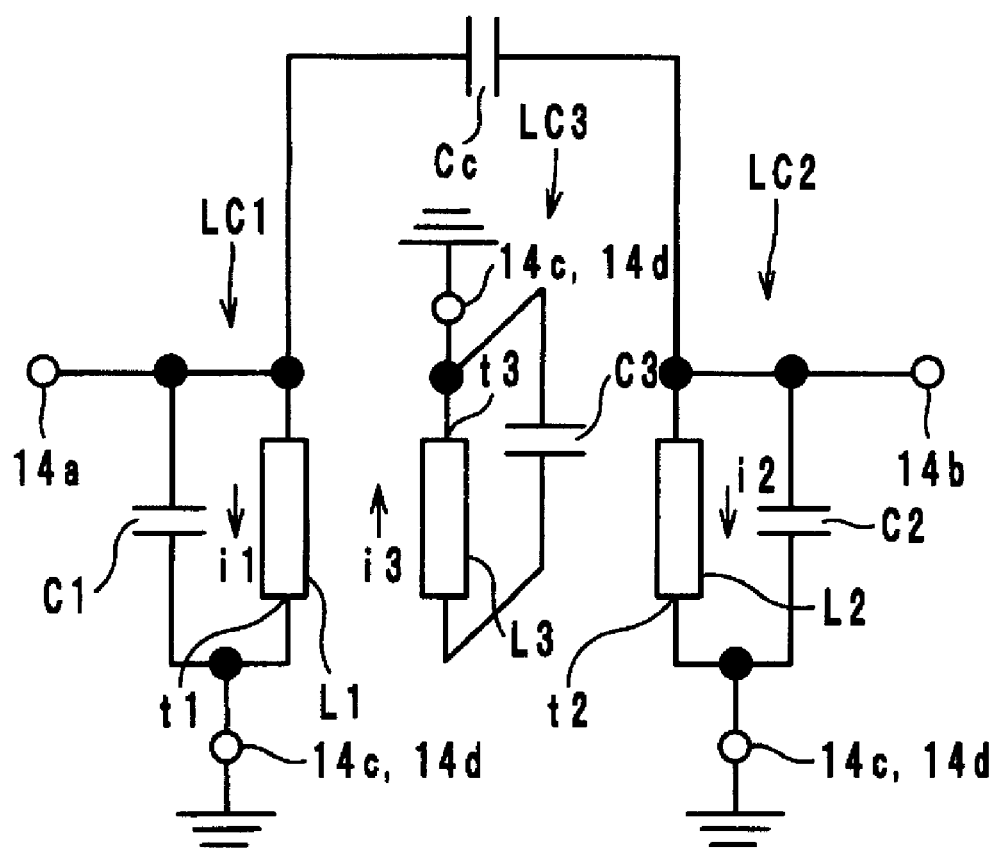
FIG. 3 is an equivalent circuit diagram of the electronic component illustrated in FIG. 1.

The configuration of an electronic component according to a preferred embodiment of the present invention will be described below with reference to the accompanying drawings. FIG. 1 is an external perspective view of an electronic component 10 according to a preferred embodiment of the present invention. FIG. 2 is an exploded perspective view of a laminate 12 in the electronic component 10. FIG. 3 is an equivalent circuit diagram of the electronic component 10. Referring to FIGS. 1 and 2, a z-axis direction is a lamination direction, an x-axis direction is a direction along the long sides of the electronic component, and a y-axis direction is a direction along the short sides of the electronic component 10. The positive and negative directions of the x-axis, y-axis, and z-axis directions are with respect to the center of the laminate 12.

As illustrated in FIG. 1, the electronic component 10 preferably includes the laminate 12, external electrodes 14 (14a to 14d), a direction identification mark 15, and LC resonant circuits LC1 to LC3. As illustrated in FIG. 2, preferably, the laminate 12 includes laminated insulating layers 16 (16a to 16j) that are preferably made of a ceramic dielectric, and has a rectangular or substantially rectangular parallelepiped shape. The laminate 12 further includes the LC resonant circuits LC1 to LC3.

As illustrated in FIG. 1, the external electrode 14a is disposed on a side surface (surface) in a negative x-axis direction, and defines an input electrode. The external electrode 14b is disposed on a side surface (surface) in a positive x-axis direction, and defines an output electrode. The external electrode 14c is disposed on a side surface (surface) in a negative y-axis direction, and defines a ground electrode. The external electrode 14d is disposed on a side surface (surface) in a positive y-axis direction, and defines a ground electrode.

The direction identification mark 15 is provided on a top surface of the laminate 12 in a positive z-axis direction, and is used to identify the direction or orientation of the electronic component 10 at the time of installation.

As illustrated in FIG. 2, the insulating layers 16 are preferably rectangular or substantially rectangular, and are preferably made of, for example, a ceramic dielectric. The insulating layers 16a to 16i are laminated in this order in the z-axis direction.

As illustrated in FIG. 3, preferably the LC resonant circuit LC1 includes a coil L1 and a capacitor C1, and is disposed between the external electrode 14a and each of the external electrodes 14c and 14d. As illustrated in FIG. 2, the coil L1 includes coil conductors 18a and 18b and a via-hole conductor b1. The coil conductors 18a and 18b include coil portions 30a and 30b and lead portions 32a and 32b, respectively. The coil portions 30a and 30b are preferably linear conductors that extend from the external electrode 14a to the external electrode 14d while turning in a direction represented by an arrow A (clockwise direction) on the insulating layers 16b and 16c in plan view from the z-axis direction. The lead portion 32a is connected to one end of the coil portion 30a, and is in contact with the short side of the insulating layer 16b in the negative x-axis direction. As a result, the coil conductor 18a is connected to the external electrode 14a. Similarly, the lead portion 32b is connected to one end of the coil portion 30b, and is in contact with the long side of the insulating layer 16c in the positive y-axis direction. As a result, the coil conductor 18b is connected to the external electrode 14d.

The other ends of the coil portions 30a and 30b overlap each other in plan view from the z-axis direction. The via-hole conductor b1 passes through the insulating layer 16b in the z-axis direction, and connects the other ends of the coil portions 30a and 30b. As a result, the coil L1 is connected between the external electrodes 14a and 14d.

The capacitor C1 includes capacitor conductors 20f and 20i. The capacitor conductor 20f is preferably a rectangular or substantially rectangular conductor disposed on the insulating layer 16i, and extends to the short side of the insulating layer 16i in the negative x-axis direction. The capacitor conductor 20i is preferably a rectangular or substantially rectangular conductor covering substantially an entire surface of the insulating layer 16j, and is in contact with the long sides of the insulating layer 16j in the positive and negative y-axis directions. The capacitor conductors 20f and 20i face each other with the insulating layer 16i therebetween, and define the capacitor C1. The capacitor C1 is connected between the external electrodes 14a and 14c and between the external electrodes 14a and 14d. The coil L1 is connected between the external electrodes 14a and 14d as described previously. Accordingly, the capacitor C1 is connected in parallel to the coil L1.

As illustrated in FIG. 3, preferably, the LC resonant circuit LC2 includes a coil L2 and a capacitor C2, and is disposed between the external electrode 14b and each of the external electrodes 14c and 14d. As illustrated in FIG. 2, the coil L2 includes coil conductors 18c and 18d and a via-hole conductor b2. The coil conductors 18c and 18d include coil portions 30c and 30d and lead portions 32c and 32d, respectively. The coil portions 30c and 30d are preferably linear conductors that extend from the external electrode 14b to the external electrode 14c while turning in the direction represented by the arrow A on the insulating layers 16b and 16c in plan view from the z-axis direction. The lead portion 32c is connected to one end of the coil portion 30c, and is in contact with the short side of the insulating layer 16b in the positive x-axis direction. As a result, the coil conductor 18c is connected to the external electrode 14b. Similarly, the lead portion 32d is connected to one end of the coil portion 30d, and is in contact with the long side of the insulating layer 16c in the negative y-axis direction. As a result, the coil conductor 18d is connected to the external electrode 14c.

The other ends of the coil portions 30c and 30d overlap each other in plan view from the z-axis direction. The via-hole conductor b2 passes through the insulating layer 16b in the z-axis direction, and connects the other ends of the coil portions 30c and 30d. As a result, the coil L2 is connected between the external electrodes 14b and 14c.

The capacitor C2 includes a capacitor conductor 20h and the capacitor conductor 20i. The capacitor conductor 20h is preferably a rectangular or substantially rectangular conductor arranged with the capacitor conductor 20f in the x-axis direction on the insulating layer 16i, and extends to the short side of the insulating layer 16i in the positive x-axis direction. The capacitor conductor 20i faces the capacitor conductor 20h with the insulating layer 16i therebetween. As a result, the capacitor conductors 20h and 20i define the capacitor C2. The capacitor C2 is connected between the external electrodes 14b and each of the external electrodes 14c and 14d. The coil L2 is connected between the external electrodes 14b and 14c as described previously. Accordingly, the capacitor C2 is connected in parallel to the coil L2.

As illustrated in FIG. 3, preferably, the LC resonant circuit LC3 includes a coil L3 and a capacitor C3, and is connected to the external electrodes 14c and 14d. As illustrated in FIG. 2, the coil L3 includes coil conductors 18e and 18f and a via-hole conductor b3. The coil conductor 18e includes a coil portion 30e and a lead portion 32e. The coil conductor 18f includes a coil portion 30f. The coil portions 30e and 30f are preferably linear conductors that extend from the capacitor C3 to the external electrode 14d while turning in a direction represented by an arrow B (counterclockwise direction) opposite to the direction represented by the arrow A on the insulating layers 16d and 16e in plan view from the z-axis direction. In addition, the coil portions 30e and 30f turn in the direction represented by the arrow B around the coil portions 30a to 30d in plan view from the z-axis direction. That is, the coil portions 30a to 30d are in an area that is surrounded by the coil portions 30e and 30f. The lead portion 32e is connected to one end of the coil portion 30e, and is in contact with the long side of the insulating layer 16d in the positive y-axis direction. As a result, the coil L3 is connected to the external electrode 14d.

The other end of the coil portion 30e and one end of the coil portion 30f overlap each other in plan view from the z-axis direction. The via-hole conductor b3 passes through the insulating layer 16d in the z-axis direction, and connects the other end of the coil portion 30e and one end of the coil portion 30f.

The capacitor C3 includes the capacitor conductor 20i and a capacitor conductor 20g. The capacitor conductor 20g is preferably a rectangular or substantially rectangular conductor disposed between the capacitor conductors 20f and 20h on the insulating layer 16i, and does not extend to the short or the long side of the insulating layer 16i. The capacitor conductor 20i faces the capacitor conductor 20g with the insulating layer 16i therebetween. As a result, the capacitor conductors 20i and 20g define the capacitor C3.

Via-hole conductors b4 to b7 pass through the insulating layers 16e to 16h, respectively, in the z-axis direction, and connect the other end of the coil portion 30f and the capacitor conductor 20g. As a result, as illustrated in FIG. 3, the coil L3 is connected to the capacitor C3. Since the capacitor conductor 20i is connected to the external electrodes 14c and 14d, the capacitor C3 is also connected to the external electrodes 14c and 14d.

A capacitor conductor 20a extends in the x-axis direction on the insulating layer 16f, thereby overlapping capacitor conductors 20b and 20d in plan view from the z-axis direction. As a result, the capacitor conductor 20a generates capacitive coupling Cc between the capacitors C1 and C2 illustrated in FIG. 3.

A capacitor conductor 20e extends in the x-axis direction on the insulating layer 16h, thereby overlapping the capacitor conductors 20b, 20d, 20f, and 20h in plan view from the z-axis direction. As a result, the capacitor conductor 20e also generates the capacitive coupling Cc between the capacitors C1 and C2. The capacitor conductors 20a and 20e couple the LC resonant circuits LC1 and LC3 and improve an attenuation characteristic near a pass band.

The capacitor conductors 20b and 20d preferably have the same or substantially the same configurations as those of the capacitor conductors 20f and 20h, respectively, and are disposed on the insulating layer 16g. The capacitor conductors 20b and 20d are portions of the capacitors C1 and C2, respectively, and function to produce a capacitance.

The capacitor conductor 20c preferably has the same or substantially the same configuration as that of the capacitor conductor 20g, and is disposed on the insulating layer 16g. The capacitor conductor 20c is a portion of the capacitor C3, and functions to produce a capacitance. The capacitor conductor 20i is connected to a ground electrode of an external circuit via the external electrodes 14c and 14d, and also functions as a ground conductor in the laminate 12.

In the electronic component 10 having the above-described configuration, the coils L1 and L3 are electromagnetically coupled and the coils L2 and L3 are electromagnetically coupled. As a result, the electronic component 10 defines a band-pass filter that passes only a signal of a predetermined frequency band.

An exemplary operation of the electronic component 10 will be described below with reference to FIGS. 1 to 3. As illustrated in FIGS. 2 and 3, in the electronic component 10, one end of the coil L1 is connected to the external electrode 14a that is an input electrode and the other end of the coil L1 is connected to the external electrode 14d that is a ground electrode. Accordingly, a current i1 passes through the coil L1 from the external electrode 14a to the external electrode 14d. In FIG. 2, the current i1 flows in the direction represented by the arrow A.

The coils L1 and L3 are electromagnetically coupled. Accordingly, when the current i1 flows through the coil L1, a current i3 flows through the coil L3 by electromagnetic induction. One end of the coil L3 is connected to the capacitor C3, and the other end of the coil L3 is connected to the external electrode 14d that is a ground electrode. Therefore, the current i3 flows from the capacitor C3 to the external electrode 14d. In FIG. 2, the current i3 flows in the direction represented by the arrow B opposite to the direction represented by the arrow A.

The coils L2 and L3 are electromagnetically coupled. Accordingly, when the current i3 flows through the coil L3, a current i2 flows through the coil L2 by electromagnetic induction. One end of the coil L2 is connected to the external electrode 14b that is an output electrode, and the other end of the coil L2 is connected to the external electrode 14c that is a ground electrode. Therefore, the current i2 flows from the external electrode 14b to the external electrode 14c. In FIG. 2, the current i2 flows in the direction represented by the arrow A. Thus, an output signal of a predetermined frequency band is output from the external electrode 14b.

Figure 4:
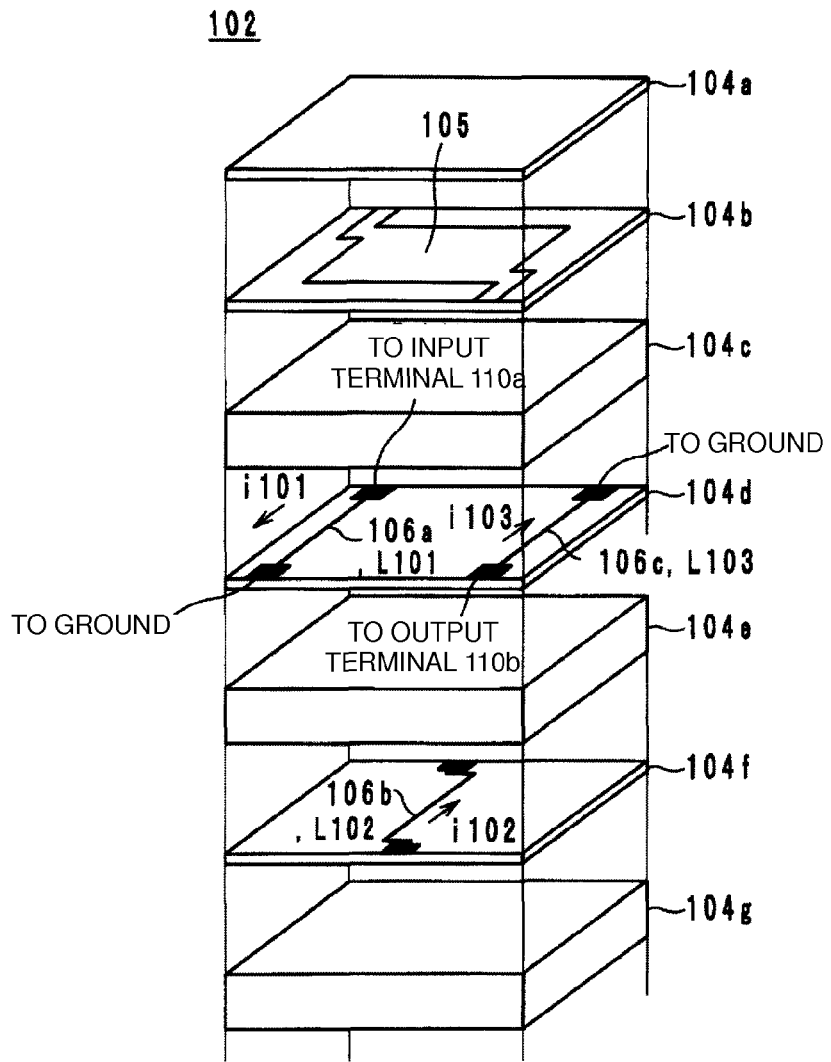
FIG. 4 is a partially exploded perspective view of a laminate in a multilayer LC filter disclosed in Japanese Unexamined Patent Application Publication No. 9-307389.
Figure 5:
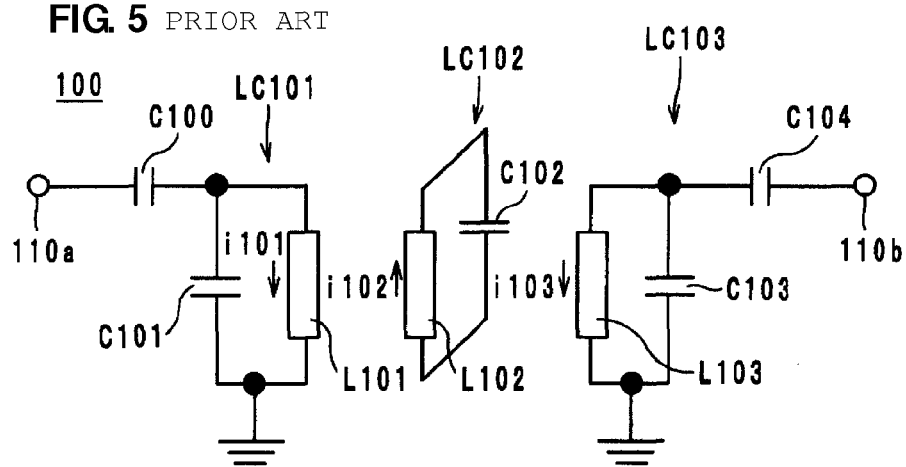
FIG. 5 is an equivalent circuit diagram of the multilayer LC filter illustrated in FIG. 4.

In the electronic component 10 having the above-described configuration, miniaturization and the narrowing of a pass band for a signal are achieved. More specifically, as illustrated in FIG. 4, in the multilayer LC filter 100, the coils L101 to L103 include the straight strip lines 106a to 106c, respectively. Accordingly, magnetic fluxes are generated around the strip lines 106a to 106c. In this case, the magnetic fluxes generated at the coils L101 to L103 are distributed over a relatively wide area. Accordingly, the coils L101 to L103 are easily electromagnetically coupled to one another, and a coupling coefficient among the coils L101 to L103 is easily increased. When a coupling coefficient between coils is increased, a pass band for a signal is broadened. Accordingly, in the multilayer LC filter 100, a pass band for a signal is broadened.

In order to reduce the coupling coefficient among the coils L101 to L103, a method of increasing the distances between the strip lines 106a to 106c may be considered. Using this method, the coupling coefficient of the coils L101 to L103 can be reduced.

However, in this case, the size of the multilayer LC filter 100 is increased. Therefore, it is difficult to achieve both miniaturization and the narrowing of a frequency band in the multilayer LC filter 100.

On the other hand, in the electronic component 10, as illustrated in FIGS. 2 and 3, the coils L1 and L2 have parallel or substantially parallel coil axes and are arranged in the x-axis direction. The turning direction of the current i1 flowing through the coil L1 is preferably the same as that of the current i2 flowing through the coil L2. Accordingly, magnetic fluxes generated by the coils L1 and L2 cancel each other. Therefore, the coils L1 and L2 are not significantly magnetically coupled. As a result, it is possible to arrange the coils L1 and L2 closer to each other while maintaining a small coupling coefficient between the coils L1 and L2.

The coil L3 surrounds the coils L1 and L2 in plan view from the z-axis direction. The turning direction of the current i3 flowing through the coil L3 is opposite to that of the currents i1 and i2 flowing through the coils L1 and L2. Accordingly, a magnetic flux generated by the coil L3 and a magnetic flux generated by each of the coils L1 and L2 cancel each other. Therefore, even if the coil L3 is arranged so that it overlaps the coils L1 and L2 in plan view from the z-axis direction, a coupling coefficient between the coil L3 and each of the coils L1 and L2 is not significantly increased. Therefore, in the electronic component 10, it is possible to arrange the coils L1 to L3 closer to one another while reducing a coupling coefficient among the coils L1 to L3. As a result, in the electronic component 10, it is possible to achieve both miniaturization and the narrowing of a frequency band.

A magnetic flux generated by the spiral coil conductors 18 is distributed over a narrower area as compared to a magnetic flux generated by the straight strip lines 106. Accordingly, coupling among the coils L1 to L3 is less than that among the coils L101 to L103. Therefore, in the electronic component 10, it is possible to arrange the coils L1 to L3 closer to one another while reducing a coupling coefficient among the coils L1 to L3. As a result, in the electronic component 10, it is possible to achieve both miniaturization and the narrowing of a frequency band.

In the electronic component 10, the coil conductors 18a to 18d included in the coils L1 and L2 are preferably disposed on the insulating layers 16 that are different from the insulating layers 16 on which the coil conductors 18e and 18f included in the coil L3 are disposed. Accordingly, the distance between the coils L1 and L3 and the distance between the coils L2 and L3 is increased. As a result, the coupling coefficient between the coils L1 and L3 and the coupling coefficient between the coils L2 and L3 is reduced. Therefore, in the electronic component 10, it is possible to further narrow a pass band for a signal.

In a multi-stage filter including a plurality of resonators, the insertion loss of the filter can preferably be reduced by increasing the unloaded Q of a center-stage resonator since power is concentrated at the center-stage resonator. As illustrated in FIG. 2, by disposing the second-stage coil conductors 18e and 18f on the insulating layers 16d and 16e, respectively, which are different from the insulating layer 16b on which the first-stage coil conductor 18a and the third-stage coil conductor 18c are disposed and the insulating layer 16c on which the first-stage coil conductor 18b and the third-stage coil conductor 18d are disposed, the unloaded Q of the second-stage coil L2 is increased.

In addition, by disposing the coil conductors 18a to 18d on the insulating layers 16 different from the insulating layers 16 on which the coil conductors 18e and 18f are disposed, the distance between the coil conductors 18a to 18d and the coil conductors 18e and 18f can be easily adjusted. As a result, the coupling coefficient between the coils L1 and L3 and the coupling coefficient between the coils L2 and L3 is easily adjusted. Therefore, it is possible to easily control a pass band for a signal in the electronic component 10.

Next, a method of manufacturing the electronic component 10 will be described with reference to FIGS. 1 and 2.

First, ceramic green sheets to be the insulating layers 16 are prepared. Subsequently, via-hole conductors b1 to b7 are formed in the ceramic green sheets to be the insulating layers 16b and 16d to 16h. More specifically, via-holes are formed by applying a laser beam, for example, to the ceramic green sheets to be the insulating layers 16b and 16d to 16h. The via-holes are then filled with a conductive paste preferably made of, for example, Ag, Pd, Cu, Au, or an alloy thereof by, for example, a printing method.

Subsequently, a conductive paste preferably primarily including Ag, Pd, Cu, Au, or an alloy thereof, for example, is applied to the ceramic green sheets to be the insulating layers 16b to 16j by screen printing, photolithography, or other methods, for example, to form the coil conductors 18 and the capacitor conductors 20. In order to form the coil conductors 18 and the capacitor conductors 20, the charging of conductive paste into via-holes may preferably be performed.

Subsequently, the ceramic green sheets are laminated. More specifically, the ceramic green sheet to be the insulating layer 16j is provided. The ceramic green sheet to be the insulating layer 16i is disposed on the ceramic green sheet to be the insulating layer 16j and is then pressure-bonded thereto. Subsequently, the ceramic green sheets to be the insulating layers 16h, 16g, 16f, 16e, 16d, 16C, 16b, and 16a are similarly laminated and pressure-bonded in this order. Consequently, a mother laminate is formed. Permanent pressure-bonding is preferably performed on the mother laminate by isostatic pressing or other suitable method, for example.

Subsequently, the mother laminate is cut into the laminate 12 having predetermined dimensions with a cutting edge. Debinding processing and firing are performed on the green laminate 12.

Thus, the fired laminate 12 is obtained. The laminate is preferably chamfered by mass finishing. Subsequently, silver electrodes to be the external electrodes 14 are formed on the surface of the laminate 12 by applying to the laminate 12 an electrode paste preferably primarily including, for example, silver using, for example, an immersion method and then by baking the electrode paste.

Finally, the external electrodes 14 are preferably formed by providing Ni plating/Sn plating on the surface of the silver electrodes. Thus, the electronic component 10 illustrated in FIG. 1 is completed.

Preferred embodiments of the present invention are useful for an electronic component, and, in particular, are advantageous in their ability to narrow a pass band for a signal in an electronic component including a filter.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic component comprising:
    a laminate including a plurality of stacked insulating layers;
    an input electrode, an output electrode, and a ground electrode disposed on surfaces of the laminate;
    a first resonant circuit including a first coil extending from the input electrode to the ground electrode and including a first coil portion that turns in a predetermined direction when viewed in a stacking direction in which the plurality of insulating layers of the laminate are stacked;

a second resonant circuit including a second coil extending from the output electrode to the ground electrode and including a second coil portion that turns in the predetermined direction when viewed in the stacking direction; and a third resonant circuit including a third coil electromagnetically coupled to the first coil and the second coil and a third capacitor; wherein the third coil extends from the third capacitor to the ground electrode and includes a third coil portion that turns in a direction opposite to the predetermined direction around the first coil portion and the second coil portion such that the first and second coil portions are disposed in an area that is surrounded by the third coil portion when viewed in the stacking direction.

2. The electronic component according to claim 1, wherein
the first resonant circuit further includes a first capacitor connected in parallel to the first coil; and
the second resonant circuit further includes a second capacitor connected in parallel to the second coil.

3. The electronic component according to claim 1, wherein the third capacitor is connected to the third coil and the ground electrode.

4. The electronic component according to claim 1, wherein the first coil portion and the second coil portion are disposed on a first one of the plurality of insulating layers different from a second one of the plurality of insulating layers on which the third coil portion is disposed.

* * * * *